United States Patent [19]
Morelos-Zaragoza et al.

[11] Patent Number: 6,138,265
[45] Date of Patent: Oct. 24, 2000

[54] DECODING TRELLIS CODED MODULATED DATA WITH A CONVENTIONAL VITERBI DECODER

[75] Inventors: Robert Morelos-Zaragoza, Sunnyvale; Advait Mogre, Fremont; Cheng Qian, Santa Clara; Rajesh Juluri, San Jose, all of Calif.

[73] Assignee: LSI Logic Corporation, Milpitas, Calif.

[21] Appl. No.: 09/100,510

[22] Filed: Jun. 19, 1998

Related U.S. Application Data

[63] Continuation-in-part of application No. 09/018,678, Feb. 4, 1998, Pat. No. 6,101,626.

[51] Int. Cl.$^7$ .................................................. H03M 13/03
[52] U.S. Cl. ........................... 714/792; 714/746; 714/795; 714/786
[58] Field of Search .................................. 714/795, 746, 714/794, 792, 786, 759; 375/265, 341

[56] References Cited

U.S. PATENT DOCUMENTS 5,396,518  3/1995  How .......................... 714/792

*Primary Examiner*—Phung M. Chung

[57] ABSTRACT

The present invention performs decoding of trellis coded modulated data using a conventional decoder by splitting up the tasks of estimating the uncoded portion and estimating the coded portion into separate tasks. The task of estimating the coded portion is performed based on a transformation on the input symbols and by taking advantage of the symmetry of the constellation associated with the modulated data when referencing a lookup table. The lookup table may also be designed to be smaller than a straight forward implementation by taking advantage of the same symmetry of the constellation.

The alteration of the data is then corrected for, resulting in a smaller constellation (Bi Phase Shift Key for 1 coded bit per symbol systems, Quadrature Phase Shift Key for 2 coded bits per symbol systems) mapping only the coded portion of the data. This allows a conventional Viterbi decoder to estimate the coded portion. The task of estimating the uncoded portion of the data is then performed by using information about the sector of the constellation of the original data along with a re-encoded version of the estimated coded portion.

32 Claims, 8 Drawing Sheets

| Address | | | | | | | | | | | | | |
|---|---|---|---|---|---|---|---|---|---|---|---|---|---|
| I Component | | | | | | Q Component | | | | | | | |
| Sign bit | Value Bits | | | | | Sign bit | Value Bits | | | | | I_out' | Q_out' |
| 0 | 0 | 0 | 0 | 0 | 0 | 0 | 0 | 0 | 0 | 0 | 0 | | |
| 0 | 0 | 0 | 0 | 0 | 0 | 0 | 0 | 0 | 0 | 0 | 1 | | |
| 0 | 0 | 0 | 0 | 0 | 0 | 0 | 0 | 0 | 0 | 1 | 0 | | |
| 0 | 0 | 0 | 0 | 0 | 0 | 0 | 0 | 0 | 0 | 1 | 1 | | |
| 0 | 0 | 0 | 0 | 0 | 0 | 0 | 0 | 0 | 1 | 0 | 0 | | |
| 0 | 0 | 0 | 0 | 0 | 0 | 0 | 0 | 0 | 1 | 0 | 1 | | |
| 0 | 0 | 0 | 0 | 0 | 0 | 0 | 0 | 0 | 1 | 1 | 0 | | |
| 0 | 0 | 0 | 0 | 0 | 0 | 0 | 0 | 0 | 1 | 1 | 1 | | |
| 0 | 0 | 0 | 0 | 0 | 0 | 0 | 0 | 1 | 0 | 0 | 0 | | |
| 0 | 0 | 0 | 0 | 0 | 0 | 0 | 0 | 1 | 0 | 0 | 1 | | |
| 0 | 0 | 0 | 0 | 0 | 0 | 0 | 0 | 1 | 0 | 1 | 0 | | |
| 0 | 0 | 0 | 0 | 0 | 0 | 0 | 0 | 1 | 0 | 1 | 1 | | |
| 0 | 0 | 0 | 0 | 0 | 0 | 0 | 0 | 1 | 1 | 0 | 0 | | |
| 0 | 0 | 0 | 0 | 0 | 0 | 0 | 0 | 1 | 1 | 0 | 1 | | |
| 0 | 0 | 0 | 0 | 0 | 0 | 0 | 0 | 1 | 1 | 1 | 0 | | |
| 0 | 0 | 0 | 0 | 0 | 0 | 0 | 0 | 1 | 1 | 1 | 1 | | |
| 0 | 0 | 0 | 0 | 0 | 0 | 0 | 1 | 0 | 0 | 0 | 0 | | |
| 0 | 0 | 0 | 0 | 0 | 0 | 0 | 1 | 0 | 0 | 0 | 1 | | |
| 0 | 0 | 0 | 0 | 0 | 0 | 0 | 1 | 0 | 0 | 1 | 0 | | |
| 0 | 0 | 0 | 0 | 0 | 0 | 0 | 1 | 0 | 0 | 1 | 1 | | |
| 0 | 0 | 0 | 0 | 0 | 0 | 0 | 1 | 0 | 1 | 0 | 0 | | |
| 0 | 0 | 0 | 0 | 0 | 0 | 0 | 1 | 0 | 1 | 0 | 1 | | |

*FIG. 10*

| Address | | | | | | | | | | I_out' | Q_out' |
|---|---|---|---|---|---|---|---|---|---|---|---|
| I Component Value Bits | | | | | Q Component Value Bits | | | | | | |
| 0 | 0 | 0 | 0 | 0 | 0 | 0 | 0 | 0 | 0 | | |
| 0 | 0 | 0 | 0 | 0 | 0 | 0 | 0 | 0 | 1 | | |
| 0 | 0 | 0 | 0 | 0 | 0 | 0 | 0 | 1 | 0 | | |
| 0 | 0 | 0 | 0 | 0 | 0 | 0 | 0 | 1 | 1 | | |
| 0 | 0 | 0 | 0 | 0 | 0 | 0 | 1 | 0 | 0 | | |
| 0 | 0 | 0 | 0 | 0 | 0 | 0 | 1 | 0 | 1 | | |
| 0 | 0 | 0 | 0 | 0 | 0 | 0 | 1 | 1 | 0 | | |
| 0 | 0 | 0 | 0 | 0 | 0 | 0 | 1 | 1 | 1 | | |
| 0 | 0 | 0 | 0 | 0 | 0 | 1 | 0 | 0 | 0 | | |
| 0 | 0 | 0 | 0 | 0 | 0 | 1 | 0 | 0 | 1 | | |
| 0 | 0 | 0 | 0 | 0 | 0 | 1 | 0 | 1 | 0 | | |
| 0 | 0 | 0 | 0 | 0 | 0 | 1 | 0 | 1 | 1 | | |
| 0 | 0 | 0 | 0 | 0 | 0 | 1 | 1 | 0 | 0 | | |
| 0 | 0 | 0 | 0 | 0 | 0 | 1 | 1 | 0 | 1 | | |
| 0 | 0 | 0 | 0 | 0 | 0 | 1 | 1 | 1 | 0 | | |
| 0 | 0 | 0 | 0 | 0 | 0 | 1 | 1 | 1 | 1 | | |
| 0 | 0 | 0 | 0 | 0 | 1 | 0 | 0 | 0 | 0 | | |
| 0 | 0 | 0 | 0 | 0 | 1 | 0 | 0 | 0 | 1 | | |
| 0 | 0 | 0 | 0 | 0 | 1 | 0 | 0 | 1 | 0 | | |
| 0 | 0 | 0 | 0 | 0 | 1 | 0 | 0 | 1 | 1 | | |
| 0 | 0 | 0 | 0 | 0 | 1 | 0 | 1 | 0 | 0 | | |
| 0 | 0 | 0 | 0 | 0 | 1 | 0 | 1 | 0 | 1 | | |

*FIG. 11*

| Sector | Lookup Address | | I_out | Q_out |
|---|---|---|---|---|
| 0 | I_abs | Q_abs | I_out' | Q_out |
| 1 | I_abs | Q_abs | I_out' | Q_out |
| 2 | Q_abs | I_abs | −I_out' | −Q_out |
| 3 | Q_abs | I_abs | −I_out' | −Q_out |
| 4 | I_abs | Q_abs | I_out' | Q_out |
| 5 | I_abs | Q_abs | I_out' | Q_out |
| 6 | Q_abs | I_abs | −I_out' | −Q_out |
| 7 | Q_abs | I_abs | −I_out | −Q_out |

| Coset \ Sector | 7 | 6 | 5 | 4 | 3 | 2 | 1 | 0 |
|---|---|---|---|---|---|---|---|---|
| 00 | 0 | 0 | 1 | 1 | 1 | 1 | 0 | 0 |
| 01 | 0 | 1 | 1 | 1 | 1 | 0 | 0 | 0 |
| 11 | 1 | 1 | 1 | 1 | 0 | 0 | 0 | 0 |
| 10 | 1 | 1 | 1 | 0 | 0 | 0 | 0 | 1 |

DECODING TRELLIS CODED MODULATED DATA WITH A CONVENTIONAL VITERBI DECODER

CROSS-REFERENCE TO RELATED APPLICATION

This is a continuation-in-part of patent application Ser. No. 09/018,678, filed Feb. 4, 1998, now U.S. Pat. No. 6,101,626, and entitled, "Method for choosing coding schemes, mappings, and puncturing rates for modulation/encoding systems", by inventors Robert Morelos-Zaragoza and Advait Mogre, assignors to LSI Logic Corporation, a Delaware corporation.

BACKGROUND OF THE INVENTION

1. Field of the Invention

The present invention relates to the decoding of modulated signals. More specifically, the present invention relates to decoding trellis coded modulated data using a conventional Viterbi decoder.

2. The Background Art

FIG. 1 is a block diagram illustrating a communications system having digital signal transmission and reception. A transmission portion of the system includes an encoder 10, a puncture module 12, and a modulator 14 providing a coded modulated signal at a communication channel 16. Similarly, a reception portion of the digital signal transmission and reception system includes a demodulator 18, a depuncturing module 20, and a decoder 22.

The encoder 10 may be a convolutional encoder. Convolutional codes typically include redundant symbols to increase the effective signal to noise ratio. In this manner, the probability of errors introduced during transmission is reduced. Standard convolutional coding techniques increase required bandwidth. However, some of the coded bits may be systematically removed in favorable channel conditions through a process called puncturing.

The encoder 10 is defined by the number of coded bits per symbol (CBPS) it produces as well as by its rate, which is defined as the ratio between the number of input bits to the number of output bits. For an encoder, the rate is equal to the number of input bits to the decoder divided by the number of output bits per symbol it produces. Thus, an encoder that takes a single bit and produces two coded bits has a rate of ½. The ratio is read inversely for the decoder, thus a decoder with a rate of ½ takes two coded bits and produces a single decoded bit.

The modulated signal includes an in-phase (I) component and a quadrature (Q) component. When the modulated signal is received, after conversion from an analog to a digital signal, each bit is demodulated into the in-phase and quadrature signal components by the demodulator 18 using sine and cosine functions.

The decoder 22 is typically a Viterbi decoder. Viterbi decoders allow the system to achieve most of the coding gain promised by a particular convolutional encoder. The rate and the number of coded bits per symbol of a decoder will match that of the corresponding encoder. In order to optimally perform the decoding, most Viterbi decoders are trellis Viterbi decoders (and the matching Viterbi encoders are trellis Viterbi encoders). A trellis Viterbi decoder operates on the received in-phase (I) and quadrature (Q) signals and processes them using a trellis diagram similar to that of the convolutional encoder. FIG. 2 depicts an example trellis diagram. The trellis diagram has two states 40 and two symbol epochs. The paths from state to state are determined by the bits of the data. Thus, in FIG. 2 there are two bits in the data, evidenced by the fact that there are two parallel paths at each state transition. In general, there are $2^k$ paths out of and into a state, where k is the number of information bits.

A trellis diagram is read from left to right. Therefore, in order to determine the a values of the data bits, the trellis Viterbi decoder attempts to determine which states have been visited. FIG. 3 depicts the trellis diagram of data after it has been passed through the Viterbi decoder, which indicates the values of the data. The complexity of using the trellis Viterbi decoder system lies in the fact that there are parallel branches at each state transition. For example, in an 8-PSK system using 2 CPBS, there will be two branches at each state transisition (like the paths in FIGS. 2–3). Both of these paths represent the coded bit and each is determined by the uncoded bit. For each additional uncoded bit which is used, the number of parallel branches doubles. This increases the complexity in the implementation of these decoders.

The existence of parallel branches means that the number of data lines within the Viterbi decoder must be at least double what it would be without parallel branches (as in a conventional Viterbi decoder). This additionally leads to an increase in the size and cost of the trellis Viterbi decoder. Furthermore, more computational ability is required to process the code. Another drawback is that the memory associated with the Viterbi decoder used in the present invention (which stores a lookup table for computational purposes) must be bigger than in a conventional Viterbi decoder.

It is therefore an object of the present invention to provide a method of transforming the incoming symbols using a lookup table to allow decoding with a conventional Viterbi decoder.

It is a further object of the present invention to provide an architecture that allows for decoding of a trellis encoded sequence without using parallel branches.

It is a further object of the present invention to provide an architecture that allows for decoding of a trellis encoded sequence without using parallel branches using a conventional Viterbi decoder.

It is a further object of the present invention to provide a method for decoding trellis encoded data which requires less memory than previously required.

BRIEF DESCRIPTION OF THE INVENTION

The present invention performs decoding of trellis coded modulated data using a conventional decoder by splitting up the tasks of estimating the uncoded portion and estimating the coded portion into separate tasks. The task of estimating the coded portion is performed based on a transformation on the input symbols and by taking advantage of the symmetry of the constellation associated with the modulated data when referencing a lookup table. The lookup table may also be designed to be smaller than a straight forward implementation by taking advantage of the same symmetry of the constellation.

The alteration of the data is then corrected for, resulting in a smaller constellation (Bi Phase Shift Key for 1 coded bit per symbol systems, Quadrature Phase Shift Key for 2 coded bits per symbol systems) mapping only the coded portion of the data. This allows a conventional Viterbi decoder to estimate the coded portion. The task of estimating the uncoded portion of the data is then performed by using information about the sector of the constellation of the original data along with a re-encoded version of the estimated coded portion.

BRIEF DESCRIPTION OF THE DRAWING FIGURES

FIG. 10 is an example of a lookup table as known in the prior art.

FIG. 11 is an example of a lookup table designed for use with the present invention.

DETAILED DESCRIPTION OF THE PREFERRED EMBODIMENT

Those of ordinary skill in the art will realize that the following description of the present invention is illustrative only and not in any way limiting. Other embodiments of the invention will readily suggest themselves to such skilled persons.

Figure 1:
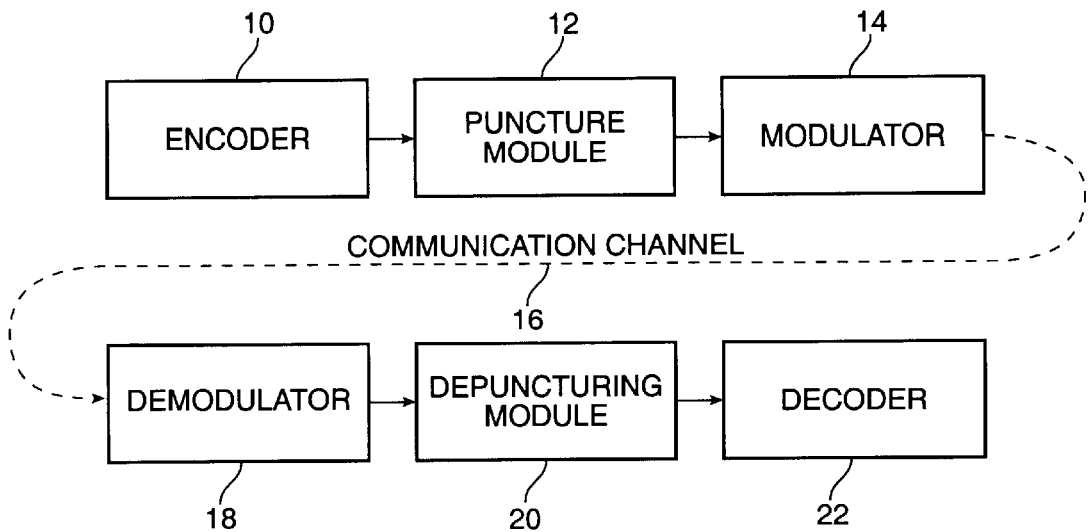
FIG. 1 is a block diagram illustrating a communications system having digital signal transmission and receiving.
Figure 2:
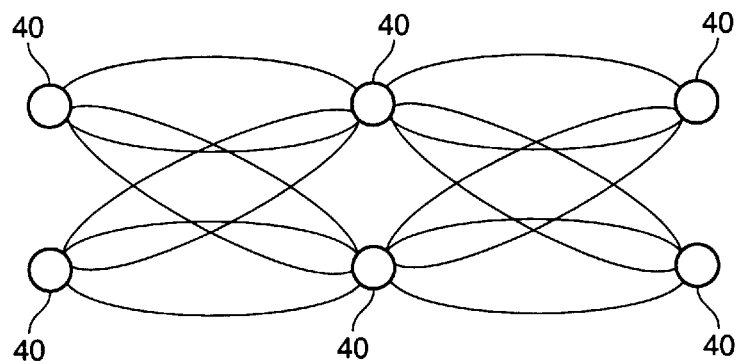
FIG. 2 is a trellis diagram having two states and two paths at each state transition.
Figure 3:
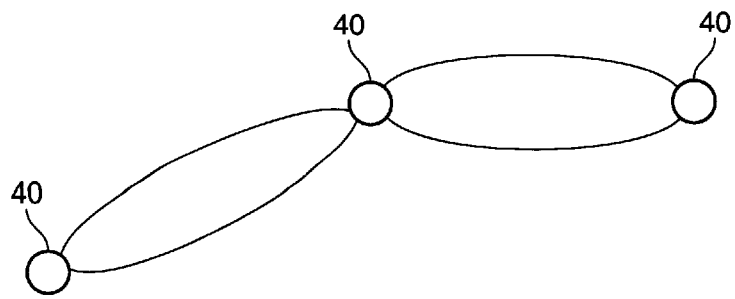
FIG. 3 is a trellis diagram showing a sample output of a trellis Viterbi decoder.
Figure 4:
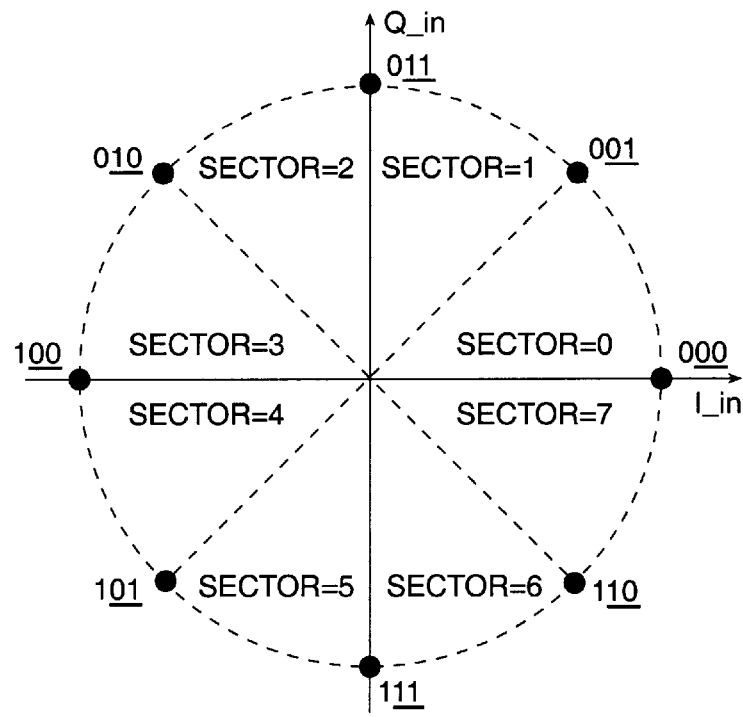
FIG. 4 is a diagram illustrating an 8-PSK contellation for 2 coded bits per symbol.
Figure 5:
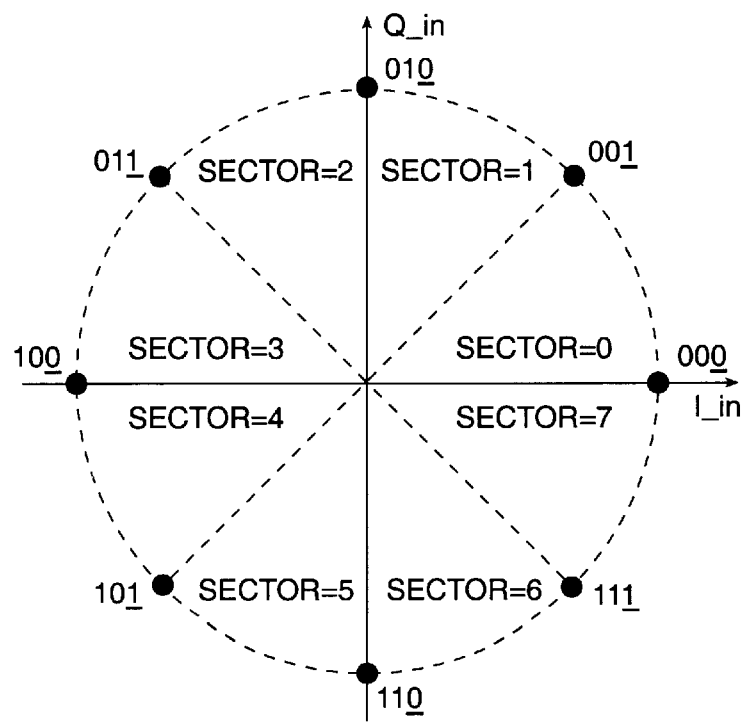
FIG. 5 is a diagtam illustrating an 8-PSK constellation for 1 coded bit per symbol.

In a trellis coded modulation system with 2 coded bits per symbol, a certain type of symmetry occurs where, for a $2^m$-PSK constellation, the signal points can be grouped into subsets, each of which is a symmetric $2^{(m-2)}$ constellation having a fixed rotation between each point in the subset. For example, the 8-PSK constellation of FIG. 4 may be grouped into four distinct subsets. The first subset contains points (000, 100). The second subset contains points (001, 101). The third subset contains points (011, 111) and the fourth subset contains points (010, 110). For 1 coded bit per symbol, if a mapping is chosen such that the least significant bit alternates between neighboring signal points, then a similar symmetry occurs. An example of this is depicted in FIG. 5, where it can be seen that the least significant bit alternates between neighboring points so this mapping would exhibit this symmetry.

Figure 6:
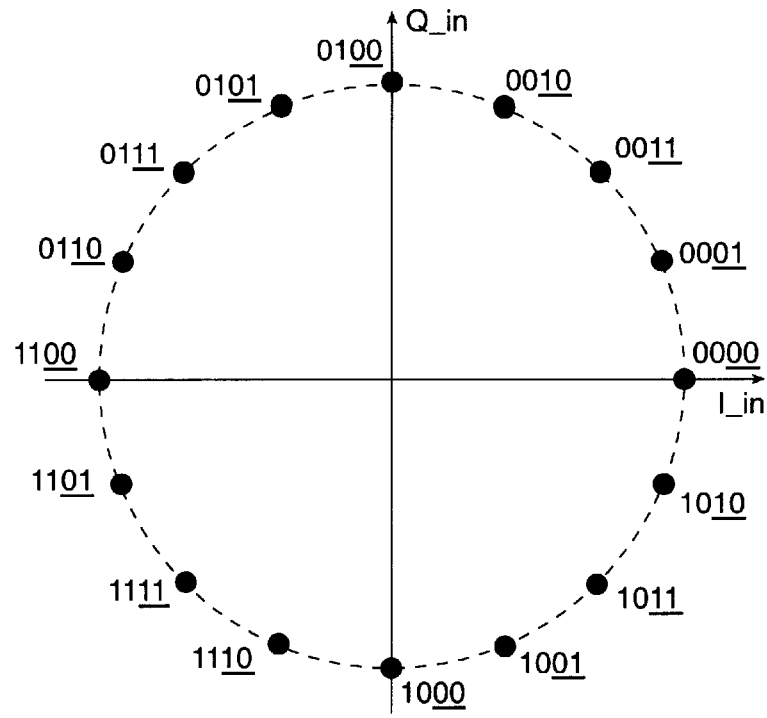
FIG. 6 is a diagram illustrating a 16-PSK constellation for 1 coded bit per symbol.
Figure 7:
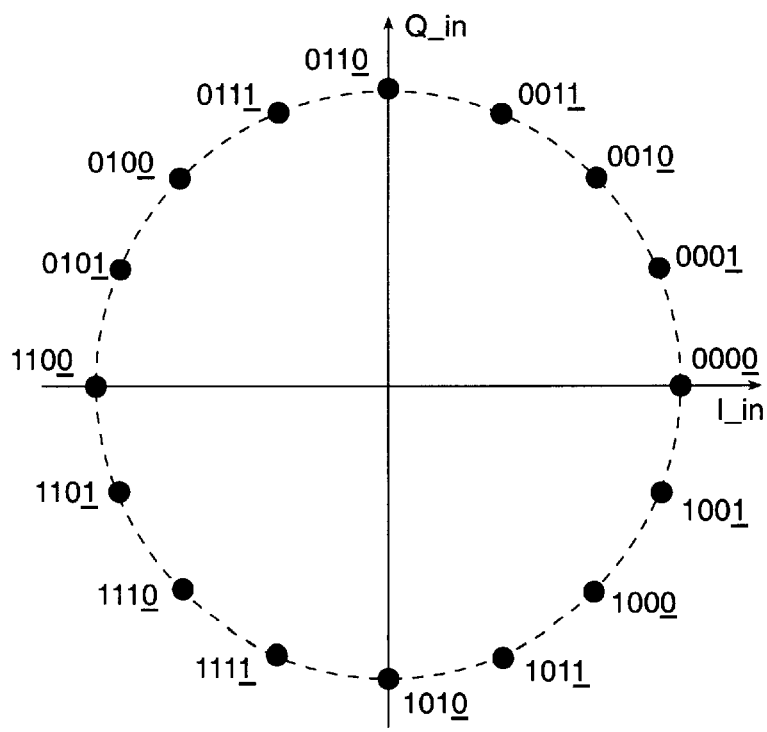
FIG. 7 is a diagram illustrating a 16-PSK constellation for 2 coded bits per symbol.

The same symmetry can be seen in the 16-PSK constellation with 2 coded bits per symbol shown in FIG. 6. The constellation depicted in FIG. 6 may be grouped in four distinct subsets. The first subset contains points (0000, 0100, 1100, 1000), the second subset contains points (0001, 0101, 1101, 1001), the third subset contains points (0011, 0111, 1111, 1011) and the fourth subset contains points (0010, 0110, 1110, 1010). The primary features of these four subsets are that the phase rotation between each point in each subset is identical (90 degrees) and that the coded bits (the two least significant bits) are identical for each point in each subset. If there is one coded bit per symbol, as depicted in FIG. 7, then the symmetry occurs because the least significant bit (the coded bit, shown by the underline underneath the number) is the opposite of each of its neighbors.

By utilizing this symmetry, it is possible to design a system which folds the original constellation into a much smaller constellation consisting of only the coded bits, allowing a conventional Viterbi decoder to decode the signal bits. For 1 CBPS systems, the constellation is converted to Bi Phase Shift Keyed (BPSK). For 2 CPBS systems, the constellation is converted to Quadrature Phase Shift Keyed (QPSK). The uncoded bits may then be determined later by using the estimated coded bits along with information regarding the sector of the original signal to estimate the uncoded bits. This two-stage decoding process allows for a much cheaper and smaller decoder to be used.

By separating the two portions, it is possible to use a standard Viterbi decoder within a trellis encoded system. Additionally, since only a portion of the constellation needs to be used in referencing the lookup table, the present invention also allows for the use of a much smaller lookup table than would otherwise be required.

Figure 8:
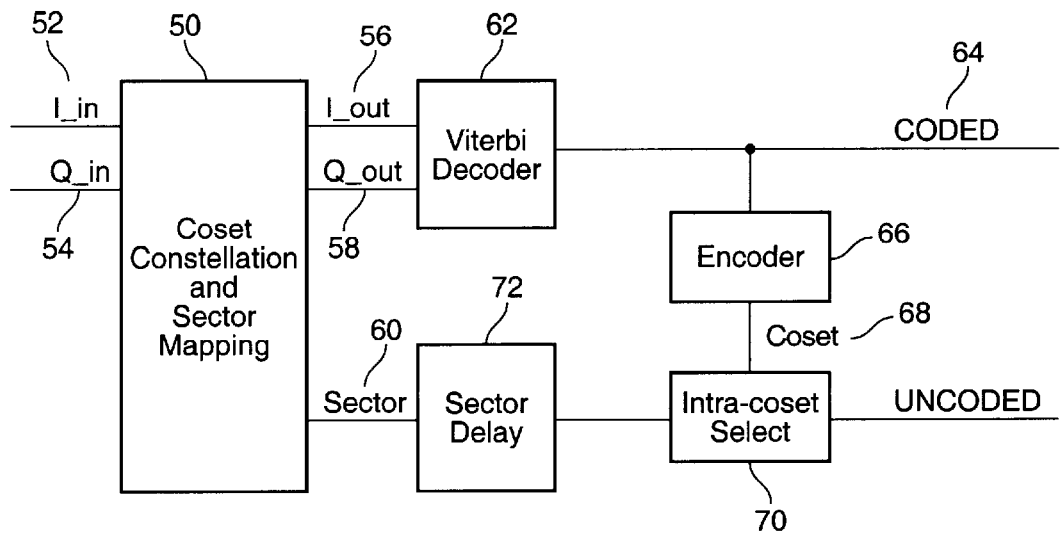
FIG. 8 is a block diagram illustrating a decoder for use with an 8-PSK constellation and 2 coded bits per symbol in accordance with a presently preferred embodiment of the present invention.

FIG. 8 is a block diagram illustrating a decoder for use with an 8-PSK constellation and 2 coded bits per symbol in accordance with a presently preferred embodiment of the present invention. The invention may be used in systems with other constellations and coded bits per symbol rates as well, requiring only minor modifications as will be readily apparent to those of ordinary skill in the art. Coset constellation and sector mapping block 50 has two inputs, I_IN 52 and Q_IN 54, and three outputs, I_OUT 56, Q_OUT 58, and sector 60. I_IN 52 and Q_IN 54 are the I and Q components of the demodulated signal and may be mapped in a constellation. Coset constellation and sector mapping block performs a transformation on I_IN 52 and Q_IN 54 to produce I_OUT 56 and Q_OUT 58, which are components of a signal point in a simpler coset constellation. Coset constellation and sector mapping block also uses I_IN 52 and Q_IN 54 to determine the sector 60 of the constellation in which the original signal lies.

Viterbi decoder 62 receives I_OUT 56 and Q_OUT 58 and performs a standard Viterbi decoding of the components, resulting in an estimation of the coded portion of the data 64. This estimated coded portion 64 is also used to estimate the uncoded portion. Encoder 66 receives the information and re-encodes it, sending the coset output 68 to an intra-coset selector 70. Intra-coset selector 70 uses the re-encoded information along with the sector information 60 to estimate the uncoded bit or bits. A sector delay 72 may have to be placed between the coset constellation and sector mapping block 50 and the intra-coset selector 70 so that the re-encoded coset information 68 reaches the intra-coset selector 70 at the same time as the sector information 60. The output of the circuit is an estimation of both the coded and uncoded portions.

Figure 9:
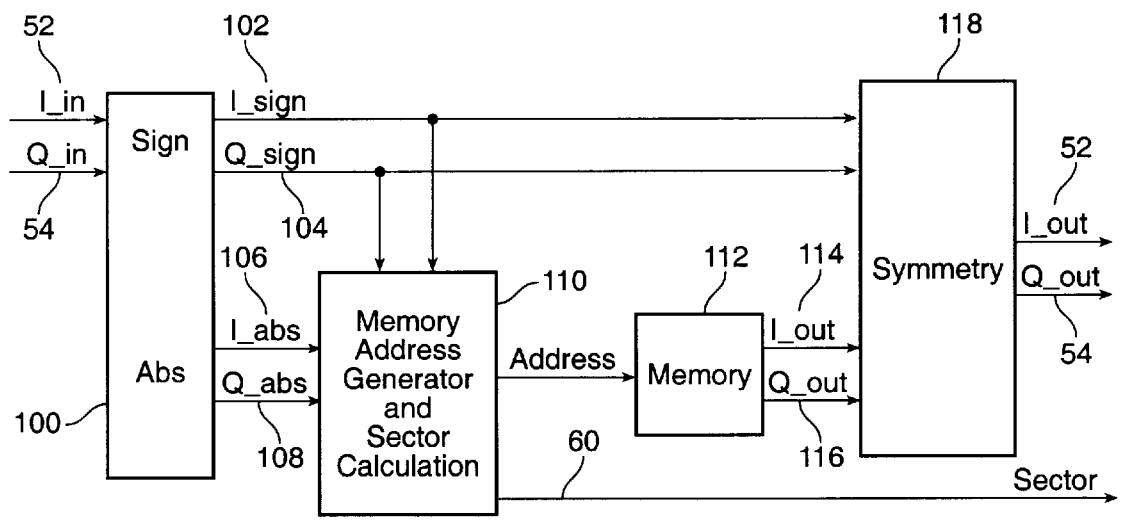
FIG. 9 is a block diagram illustrating the coset constellation mapping block of FIG. 6 in greater detail

FIG. 9 depicts the coset constellation mapping block 50 of FIG. 6 in greater detail. A splitter block 100 splits the bits of I_IN 52 and Q_IN 54 into constituent sign bits, I_SIGN 102 and Q_SIGN 104, and value bits, I_ABS 106 and Q_ABS 108. For example, in some systems, I_IN 52 and Q_IN 54 are each 6 bits long. The first bit in each represents the sign (positive or negative) of the value and the other 5 bits represent the absolute value. Thus, in this example, I_SIGN 102 and Q_SIGN 104 are each 1 bit long, while I_ABS 106 and Q_ABS 108 are each 5 bits long.

I_SIGN 102, Q_SIGN 104, I_ABS 106, and Q_ABS 108 are all used as inputs to a memory address generator and sector calculation block 110, which functions to generate an address to look up in memory 112. Memory 112 contains a lookup table of memory address and corresponding output values, I_OUT' 114 and Q_OUT' 116. FIG. 10 depicts a portion of a typical lookup table as used by the prior art to determine the coded bits. As can be seen, it is normally addressed using the sign and value bits of the I component concatenated with the sign and value bits of the Q component. Thus the table has $2^n$ entries where n is the total number of bits for both the I and Q components. For typical systems having 6 bits for each component, the table then has $2^{12}$ entries, or 4096 entries. For 1 coded bit per symbol systems, the output of the table is (I_OUT, sector).

For the present invention, the lookup table need only be indexed using the value bits of the I and Q components, without using the sign bits. FIG. 11 depicts a portion of such a lookup table. By eliminating the sign bits, the table is reduced in size by a factor of 4 (the table now has only $2^{10}$, or 1024 entries). These figures are assuming an 8-PSK system with 2 coded bits per symbol. The factor of reduction may be different in different systems as would be apparent to those of ordinary skill in the art.

Because the sign bits are no longer used to index the lookup table, however, a memory address generator (located in the memory address generator and sector calculation block 110) must be used to determine the proper output. In essence, this block maps the original point to a comparable point in the first quadrant of the constellation. This may involve swapping the I_IN 52 and Q_IN 54 values. Since the sign bits are not used in indexing the lookup table, there is no need to negate the values as might otherwise be required. The determination of whether or not to swap the values is made by examining the I_SIGN 102 and Q_SIGN 104 bits along with the I_ABS 106 and Q_ABS 108, which together indicate the sector in which the original signal lies. For example, in an 8-PSK system, if I_SIGN is positive, Q_SIGN is negative and I_ABS>Q_ABS, then the original signal lies in sector 7. A fixed table may then be referenced which indicates whether or not swapping is necessary based on the sector. These new values are then used as the address to reference the lookup table.

The lookup table then gives corresponding I_OUT' 114 and Q_OUT' 116 values for the point. The lookup table essentially performs a transformation of the incoming components. Generically, the transformation can be defined as follows. In any $2^m$-PSK trellis coded modulation system, for v=1, 2 where v is the number of coded bits per symbol:

$$(I\_OUT)' = R\cos[2^{m-v}(\varphi - \Phi)]$$

$$Q\_OUT' = R\sin[2^{m-v}(\varphi - \Phi)]$$

where $R = \sqrt{I\_IN^2 + Q\_IN^2}$, $\varphi = \tan^{-1}\left(\frac{Q\_IN}{I\_IN}\right)$, and $\Phi$ is a constant phase rotation of the constellation. This converts any 2 CBPS constellation to a QPSK constellation and any 1 CBPS constellation to a BPSK constellation.

The I_OUT' 114 and Q_OUT' 116 values may need to be corrected in a symmetry block 118, which produces corrected values I_OUT 52 and Q_OUT 54. The symmetry block 118 receives the I_SIGN 102, Q_SIGN 104, I_OUT' 114, and Q_OUT' 116 values determines whether the I_OUT' and Q_OUT' values need to be negated (i.e. I_OUT=-I_OUT', Q_OUT=-Q_OUT'). Again, a fixed table may be used in determining the need for negation, but here all that is required to determine the need for negation is the quadrant of the original signal using the sine and cosine symmetry. If the original signal was in the fourth quadrant (I_SIGN>0 and Q_SIGN<0), then when it was mapped to the first quadrant the Q component was negated. Thus it will be necessary to negate the Q component in the symmetry block to correct for the earlier negation. In essence, this is performing a phase rotation depending on the specific locations of the points of the constellation.

Referring back to FIG. 8, intra-coset selector 70 receives the re-encoded coset values 68 from the encoder 66 as well as the sector 60 from the coset constellation and sector mapping block 50. It then references a table which tells it the value of the uncoded bit based on the coset values and sector. This block is essentially examining the possible points in the constellation based on the coset values, and then picking the point closest to the sector received from the coset constellation and sector mapping block 70

Figure 12:
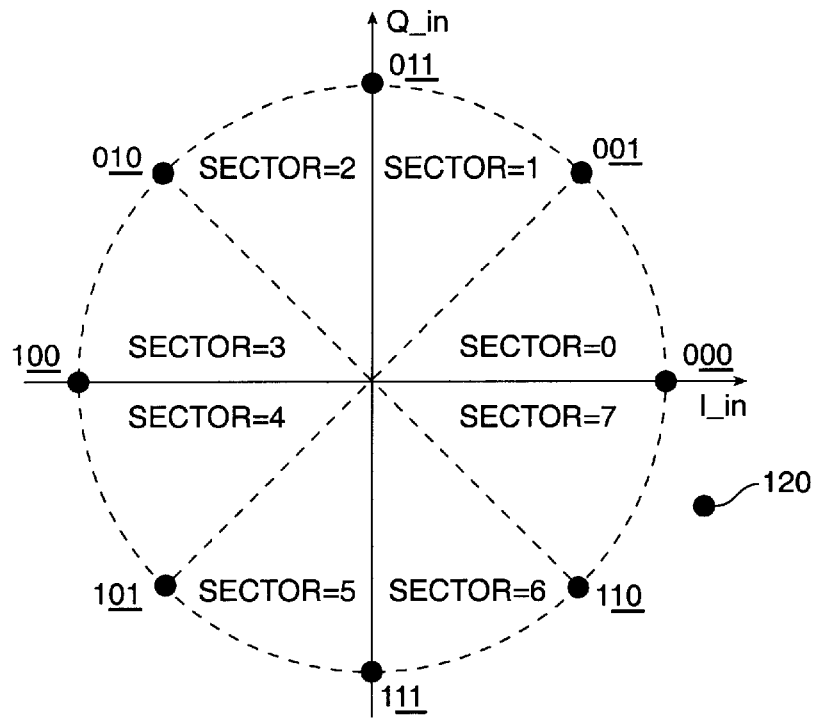
FIG. 12 is a diagram depicting a received point in an 8-PSK constellation with 2 coded bits per symbol.
Figure 13:
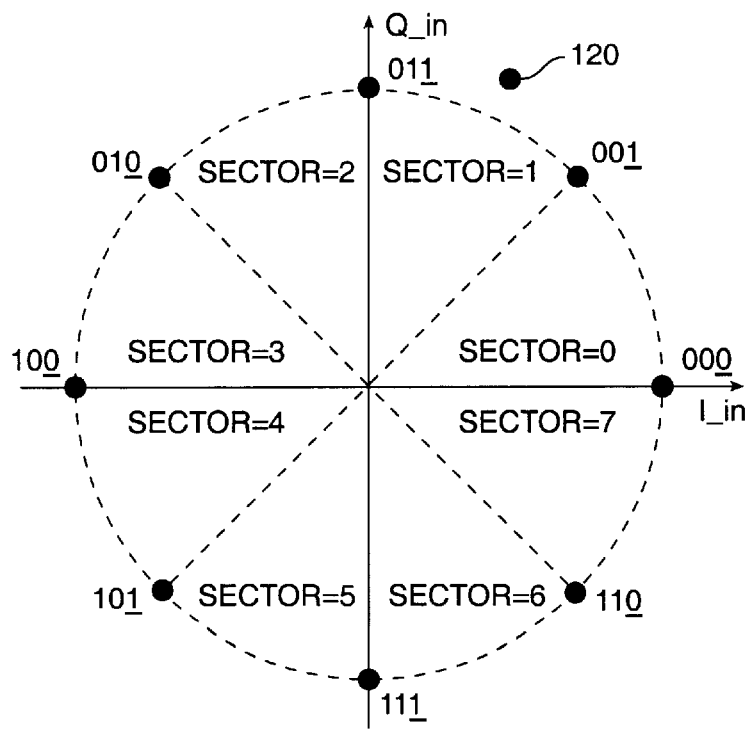
FIG. 13 is a diagram depicting a modified received point in an 8-PSK constellation with 2 coded bits per symbol, before reading from a lookup table.
Figures 14, 15, 16:
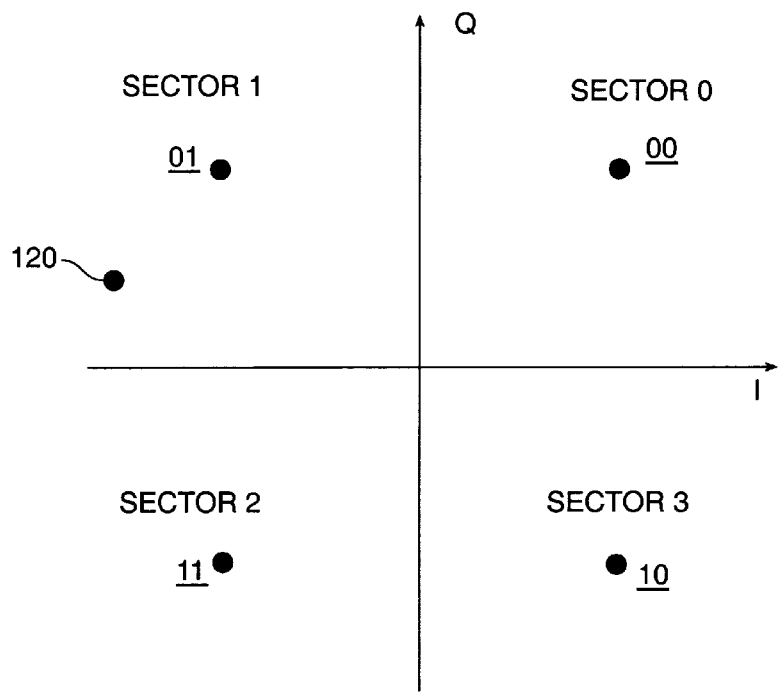
FIG. 14 is an example of a table suitable for use with both the memory address generating task and the correction tasks of the present invention.
FIG. 15 is an example of a transformed received point in the QPSK constellation generated by the lookup table in accordance with a presently preferred embodiment of the present invention.
FIG. 16 is an example of a coset select table, which is used to determine the value if an uncoded bit.

An example of the action of the present invention for an 8-PSK constellation with 2 coded bits per symbol is provided as follows. This example is for a system with a rate=½ encoding scheme. FIG. 12 depicts an 8-PSK constellation. The sectors have been numbered from 0 to 7. The received signal 120 is shown in sector 7 of the constellation in FIG. 12. I_IN and Q_IN components are received by the decoder. These are input to the coset constellation and sector mapping block. Since the received signal is located in sector 7, then I_IN will be positive and Q_IN will be negative. Then, the splitter block in the coset constellation and sector mapping block separates the signal bits from the absolute value bits, and passes them all to memory address generator and sector calculation block. The absolute value bits are used to look up the appropriate entry in the lookup table, which is only indexed by value bits. The memory address generator and sector calculation block, however, first maps the point (and every input point) to a point in the first quadrant of the 8-PSK constellation (here, sector 7 maps to sector 1). Thus, FIG. 13 depicts the 8-PSK constellation with the point used for the lookup table. This point may be generated using a table similar to that depicted in FIG. 14. The table in FIG. 14 is read as follows. First, the sector of the original input point is referenced (here, sector 7). The lookup addresses are then computed by concatenating the I_ABS and Q_ABS values in the order they appear in the table entry for that sector (here, sector 7 has Q_ABS, I_ABS thus the lookup address is Q_ABS | I_ABS).

The lookup table then is used to produce a transformation on both the received symbols and the constellation, resulting in the QPSK constellation of FIG. 15, with the point still in sector 1, but sector 1 now appearing in the second quadrant rather than the first. The problem now is that the point needs to be rotated to properly indicate the value of the coded bit (I_OUT' and Q_OUT' may not be correct). This can be performed using the table from FIG. 14. Again, the table is read in the same way, but now the I_OUT' and Q_OUT' may need to be negated to arrive at corrected values I_OUT and Q_OUT. In the present example, it will be necessary to negate both I_OUT and Q_OUT to correct for the mapping of the point from sector 7 to sector 1.

Then the I_OUT and Q_OUT values may be passed to the Viterbi decoder, which estimates the coded bit. This uncoded coded bit is then re-encoded and passed to the intra-coset selector. The sector (in the present case, sector 7) was computed in the memory address generator and sector calculation block of the coset constellation and sector mapping block. The coset values are then used along with the sector information to estimate the uncoded bit. This step may be performed using a table similar to that in FIG. 16.

Referring back to FIG. 12, the original point 120 was located near label "110", so one might assume that the uncoded bit for that point should be estimated to be 1. However, it is possible that the Viterbi decoder found an error in the transmission and actually predicted the coded bits to be, for example, 01 rather than 10. In such a case, the table in FIG. 16 is used to determine which label the original signal was supposed to be closest to, label "001", or label "101". According to the table in FIG. 17, sector 7 with a coset of 01 results in an uncoded bit of 0. Referring back to FIG. 12, one can see how this is the case, since sector 7 is closer to label "001" than to "101".

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A decoding architecture for a symmetrical system including:
    a coset constellation and sector mapping block having a first input and a second input and a first output, a second output, and a third output;
    a conventional Viterbi decoder having a first input and a second input and an output, wherein said first input is coupled to said first output of said coset constellation and sector mapping block and said second input is coupled to said second output of said coset constellation and sector mapping block;
    an encoder having an input and an output, wherein said input is coupled to said output of said conventional Viterbi decoder; and
    an intra-coset selector having a first input, a second input, and an output, said first input coupled to said output of said encoder and said second input coupled to said third output of said coset constellation and sector mapping block.

2. The decoding architecture of claim 1, wherein said coset constellation and sector mapping block includes:
    a splitter having a first input, a second input, a first output, a second output, a third output, and a fourth output;
    a memory address generator and sector calculator having a first input, a second input, a third input, a fourth input, and a first output and a second output, wherein said first input is coupled to said first output of said splitter, said second input is coupled to said second output of said splitter, said third input is coupled to said third output of said splitter, and said fourth input is coupled to said fourth output of said splitter;
    a memory store having an input, a first output, and a second output, wherein said input is coupled to said first output of said memory address generator and sector calculator; and
    a symmetry block having a first input, a second input, a third input, a fourth input, a first output and a second output wherein said first input is coupled to said first output of said splitter, said second input is coupled to said second output of said splitter, said third input is coupled to said first output of said memory store, and said fourth input is coupled to said second output of said memory store.

3. The decoding architecture of claim 1, wherein said coset constellation and sector mapping block is designed to receive an input point in the form of an in-phase and quadrature phase components, map said input point to the first quadrant of a constellation, transform said constellation to a simpler constellation, and correct for said mapping, producing in-phase and quadrature phase components of a point in the simpler constellation.

4. The decoding architecture of claim 3, wherein said coset constellation and sector mapping block is further designed to calculate the sector in which said input point lies.

5. The decoding architecture of claim 1, further including a sector delay having an input and an output, said sector delay located between said coset constellation and sector mapping block and said intra-coset selector such that said input of said sector delay is coupled to said third output of said coset constellation and sector mapping block and said output of said sector delay is coupled to said second input of said intra-coset selector.

6. The decoding architecture of claim 1, wherein said intra-coset selector is designed to estimate the uncoded portion of incoming data using an estimate of the coded portion and information about the sector of the incoming data.

7. The decoding architecture of claim 1, wherein coset constellation mapping and sector mapping block is designed to map an input point to the first quadrant of a constellation in order to take advantage of the symmetry of the system.

8. The decoding architecture of claim 7, wherein said symmetry exists in trellis coded modulation systems with one coded bit per symbol where a bit to signal mapping is chosen such that the coded bit alternates between neighboring points and in trellis coded modulation $2^m$-PSK systems with two coded bits per symbol where a bit to signal mapping is chosen such that the signal points may be grouped in subsets, each of said subsets being a symmetric $2^{(m-2)}$-PSK constellation.

9. The decoding architecture of claim 2, wherein said splitter is designed to separate input data into sign portions and value portions.

10. The decoding architecture of claim 9, wherein said splitter is further designed to separate data received on said first input into a sign portion and a value portion, said sign portion output on said first output and said value portion output on said third output, and separate data received on said second input into a sign portion and a value portion, said sign portion output on said second output and said value portion output on said fourth output.

11. The decoding architecture of claim 2, wherein said memory address generator and sector calculator is designed to map an input point to the first quadrant of a constellation.

12. The decoding architecture of claim 11, wherein said mapping is performed by generating a memory address based on data received on said third input and said fourth input, swapping said third input and fourth input if data received on said first input and said second input indicates to do so, and outputting said memory address on said first output.

13. The decoding architecture of claim 12, wherein said mapping is further performed by referencing a table indexed by sector, said sector determined by examining whether data received on said first input indicates a positive sign, whether data received on said second input indicates a positive sign, and whether data received on said third input is greater than data received on said fourth input, said table containing information on how to concatenate data received on said third input and data received on said fourth input to form a memory address.

14. The decoding architecture of claim 2, wherein said memory address generator and sector calculator determines the sector of an input point using data received on said first input, said second input, said third input, and said fourth input.

15. The decoding architecture of claim 2, wherein said memory store contains a lookup table indexed by in-phase value bits and quadrature phase value bits but not by in-phase sign bits or quadrature phase sign bits, and when referenced produces a transformation which reduces a constellation to a simpler constellation.

16. The decoding architecture of claim 15, wherein said transformation reduces the constellation to a QPSK constellation in the case of 2 coded bit per symbol systems, and reduce the constellation to a BPSK constellation in the case of 1 coded bit per symbol constellations.

17. The decoding architecture of claim 2, wherein said symmetry block corrects for mapping performed by said memory address generator and sector calculator.

18. The decoding architecture of claim 17, wherein said symmetry block corrects for said mapping by performing a phase rotation on data received on said third input and said fourth input, using data received on said first input and said second input to determine the amount of phase rotation to perform.

19. The decoding architecture of claim 18, wherein said symmetry block references a table to determine how to perform said rotation, said table indexed by sector and containing information on whether negation of data received on said third input and said fourth input is necessary.

20. A decoder for trellis coded modulated data, said data represented by I_IN and Q_IN, including:
a splitter having an I_IN input and a Q_IN input and an I_SIGN output, a Q_SIGN output, an I_ABS output, and a Q_ABS output, wherein said splitter is designed to separate the bits of both I_IN and Q_IN such that I_SIGN represents whether I_IN is positive or negative, Q_SIGN represents whether Q_IN is positive or negative, I_ABS represents the absolute value of I_IN, and Q_ABS represents the absolute value of Q_IN;
a memory address generator and sector calculator having coupled to said I_SIGN, Q_SIGN, I_ABS, and Q_ABS outputs of said splitter and having a memory address output and a sector output, wherein said memory address generator and sector calculator is designed to calculate the sector of the trellis coded modulated data by examining I_SIGN and Q_SIGN and determining whether I_ABS>Q_ABS, said memory address generator and sector calculator is further designed to generate a memory address by concatenating I_ABS and Q_ABS, the order of concatenation being determined by the sector of the trellis coded modulated data;
a memory store coupled to said memory address output of said memory address generator, and having an I_OUT' output and a Q_OUT' output, said memory store designed to contain a lookup table which converts said memory address to corresponding I_OUT' and Q_OUT' values;
a symmetry block coupled to said I_SIGN and Q_SIGN outputs of said splitter and coupled to said I_OUT' and Q_OUT' outputs of said memory store, said symmetry block having an I_OUT output and a Q_OUT output, said symmetry block designed to produce an I_OUT signal equivalent to or the negation of I_OUT' depending upon I_SIGN and Q_SIGN and said symmetry block designed to produce a Q_OUT signal equivalent to or the negation of Q_OUT' depending upon I_SIGN and Q_SIGN;
a conventional Viterbi decoder coupled to said I_OUT and Q_OUT outputs of said symmetry block and having a coded bit output;
an encoder coupled to said coded bit output of said conventional Viterbi decoder and having a coset output;
a sector delay coupled to said sector output of said memory address generator and sector calculator and having a sector output; and
an intra coset selector coupled to said coset output of said encoder and coupled to said sector output of said sector delay, said intra-coset selector having an uncoded bit output, said intra coset selector designed to produce an uncoded bit by referencing a table with said coset and said sector.

21. A method for decoding received symbols having an in-phase component and a quadrature phase component in a symmetrical system including the steps of:
plotting the received symbols as a signal point in a constellation;
determining the sector in which said signal point lies in said constellation;
mapping said signal point to the first quadrant of said constellation;
applying a transformation to said constellation to reduce it to a simpler constellation;
rotating said mapped signal point to correct for said mapping step;
decoding said rotated mapped signal point using a conventional Viterbi decoder, resulting in an estimation of the coded portion of the received symbols;
re-encoding said estimation of the coded portion of said received symbols; and
estimating the uncoded portion of the received symbols using said re-encoded estimation of the coded portion and said sector.

22. The method of claim 21, wherein said determining step includes the step of determining the sector in which said signal point lies in said constellation based on whether the in-phase component of the received symbols is positive, whether the quadrature phase component of the received symbols is positive, and whether the absolute value of the in-phase component is greater than the absolute value of the quadrature phase component.

23. The method of claim 21, wherein said mapping step further includes the step of calculating an address to be used in referencing a lookup table.

24. The method of claim 23, wherein said calculating step further includes the step of using the concatenation of the absolute values of the in-phase component and quadrature phase component as said address, the order of the concatenation being determined by examining said sector.

25. The method of claim 23, wherein said lookup table is indexed by the absolute values of the in-phase component and quadrature phase component but not by the signs of the in-phase component and quadrature phase component, taking advantage of the symmetry of the system.

26. The method of claim 21, wherein said applying step further includes the step of referencing a look-up table to determine how to transform the received symbols.

27. The method of claim 26, wherein said lookup table is indexed by the absolute values of the in-phase component and quadrature phase component but not by the signs of the in-phase component and quadrature phase component, taking advantage of the symmetry of the system.

28. The method of claim 21, wherein said applying step further includes the step of reducing said constellation to a QPSK constellation in the case of a system with 2 coded bits per symbol and reducing said constellation to a BPSK constellation in the case of a system with 1 coded bit per symbol.

29. The method of claim 21, wherein said rotating step further includes the steps of:

using the signs of the in-phase component and quadrature phase component to determine the quadrant of the received symbols; and negating the mapped signal point if necessary based on said quadrant.

30. The method of claim 21, wherein said estimating step further includes the step of determining which of several symmetrical points containing said estimated coded bits is closest to said sector.

31. The method of claim 21, wherein the symmetry exists in trellis coded modulation systems with one coded bit per symbol where a bit to signal mapping is chosen such that the coded bit alternates between neighboring points and in trellis coded modulation $2^m$-PSK systems with two coded bits per symbol where a bit to signal mapping is chosen such that the signal points may be grouped in subsets, each of said subsets being a symmetric $2^{(m-2)}$-PSK constellation.

32. A method for decoding trellis coded modulated data, said data represented by I_IN and Q_IN, including the steps of:

splitting the bits of I_IN and Q_IN into I_SIGN, Q_SIGN, I_ABS, and Q_ABS, where I_SIGN indicates whether I_IN is positive or negative, Q_SIGN indicates whether Q_IN is positive or negative, I_ABS represents the absolute value of I_IN, and Q_ABS represents the absolute value of Q_IN;

calculating the sector of the trellis coded modulated data by examining I_SIGN and Q_SIGN and by determining whether I_ABS>Q_ABS;

generating a memory address by concatenating I_ABS and Q_ABS, the order of the concatenation determined by the sector of the trellis coded modulated data;

referencing a look-up table using said memory address, converting said memory address to corresponding I_OUT' and Q_OUT' values;

producing an I_OUT signal equivalent to or the negation of I_OUT' depending upon I_SIGN and Q_SIGN and producing a Q_OUT signal equivalent to or the negation of Q_OUT' depending upon I_SIGN and Q_SIGN;

decoding I_OUT and Q_OUT using a conventional Viterbi decoder, producing a coded bit;

re-encoding said decoded coded bit, producing a coset; and estimating an uncoded bit by referencing a table with said coset and said sector.

\* \* \* \* \*